United States Patent [19]

Klaus et al.

[11] Patent Number: 6,090,442
[45] Date of Patent: Jul. 18, 2000

[54] METHOD OF GROWING FILMS ON SUBSTRATES AT ROOM TEMPERATURES USING CATALYZED BINARY REACTION SEQUENCE CHEMISTRY

[75] Inventors: Jason Klaus, Boulder, Colo.; Ofer Sneh, Branchburg, N.J.; Steven M. George, Boulder, Colo.

[73] Assignee: University Technology Corporation, Boulder, Colo.

[21] Appl. No.: 08/942,522

[22] Filed: Oct. 2, 1997

Related U.S. Application Data

[63] Continuation of application No. 08/843,269, Apr. 14, 1997, abandoned.

[51] Int. Cl.[7] ............................. C23C 16/40; C23C 16/34
[52] U.S. Cl. ............................. 427/255.15; 427/255.18; 427/255.37; 427/255.393; 427/255.394

[58] Field of Search ................... 427/255.11, 255.15, 427/255.18, 255.17, 255.19, 255.7, 255.37, 255.393, 255.394

[56] References Cited

U.S. PATENT DOCUMENTS

| | | | |
|---|---|---|---|
| 5,079,600 | 1/1992 | Schnur et al. | 427/98 |
| 5,246,886 | 9/1993 | Sakai et al. | 437/228 |

*Primary Examiner*—Timothy Meeks
*Assistant Examiner*—Bret Chen
*Attorney, Agent, or Firm*—Hill & Simpson

[57] ABSTRACT

The present invention provides a method for growing atomic layer thin films on functionalized substrates at room temperature using catalyzed binary reaction sequence chemistry. Specifically, the atomic layer films are grown using two half-reactions. Catalysts are used to activate surface species in both half-reactions thereby enabling both half-reactions to be carried out at room temperature.

40 Claims, 7 Drawing Sheets

METHOD OF GROWING FILMS ON SUBSTRATES AT ROOM TEMPERATURES USING CATALYZED BINARY REACTION SEQUENCE CHEMISTRY

RELATED APPLICATIONS

This is a continuation-in-part of U.S. patent application Ser. No. 08/843,269 filed on Apr. 14, 1997, now abandoned.

CONTRACTUAL ORIGIN OF THE INVENTION

The research was sponsored in part by the Office of Naval Research Contract No. N00014-92-J-1353. The government has certain rights in this invention.

BACKGROUND OF THE INVENTION

The present invention relates generally to the growth of films on substrates and methods of growing films on substrates using catalysts at or near room temperatures. More specifically, the present invention relates to the methods of growing film on substrates at room temperatures using catalyzed binary reaction sequence chemistry.

The development of low temperature ultra thin film deposition techniques will facilitate the development of many new technologies. Specifically, future silicon microelectronic devices will require multilevel fabrication techniques with components having nanoscale sizes in order to achieve ultra large scale integration. The reduction of component size and tolerances to the nanometer level will require extremely precise control over thin film properties such as film thickness, morphology, crystallinity, conformality and electrical properties.

However, currently available film deposition techniques require elevated temperatures ranging from 200° C. to 1000° C. Lower deposition temperatures will be needed because the interlayer diffusion of just a few atoms caused by high temperature can destroy the electrical and optical properties of such nanoscale devices.

Further, it is anticipated that silicon dioxide and ultra thin silicon dioxide films will be used in the nanoscale devices of the future because silicon dioxide has the best interface with silicon. Currently, silicon dioxide is used for many applications including optical fiber communication, microelectronics, protective coatings, electroluminescent displays, chromatography and others.

In order to push dynamic random access memory (DRAM) into the one gigabyte range, ultra thin silicon dioxide film deposition will need to be controlled on the atomic level. Further, very large flat panel displays will require extremely precise silicon dioxide film deposition on extremely large substrate areas. It is also anticipated that ultra thin silicon dioxide films will be used in multiple layer structures in order to tailor the mechanical, electrical and optical properties of technologically important materials.

Accordingly, there is a need for the development of low temperature ultra thin silicon dioxide film deposition. Currently, the ultra thin deposition of silicon dioxide may be achieved using an atomic layer controlled growth of a silicon dioxide film that incorporates a binary reaction sequence. Each half-reaction occurs on the growing surface and involves a reaction between a gas phase precursor and a surface functional group.

In the case of silicon dioxide thin film formation, the first functional group (OH) is bonded to the initial silicon or silicon dioxide surface to provide a functionalized substrate surface (Si—OH*). A first molecular precursor (SiCl$_4$) bonds to the first functional group (OH*) and links a primary element atom (Si) between the first functional group (OH*) and a second functional group (Cl*) as shown in half-reaction A below. Then, in half-reaction B, the second functional group (Cl*) is displaced by a "new" first functional group (OH*) that is provided by a second molecular precursor (H$_2$O) as shown in half-reaction B below:

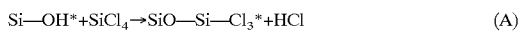

In half-reaction A, the Si—OH* represents a functionalized substrate surface or an otherwise functionalized silicon atom. The silicon tetrachloride reacts with the OH group resulting in a bond between the oxygen atom of the OH group and the silicon atom of the silicon tetrachloride with hydrochloric acid as a byproduct. Then, a second molecular precursor group in the form of water as shown in half-reaction B or hydrogen peroxide is provided which attacks one of the Si—Cl bonds to create a new functionalized silicon atom or Si—OH* bond. Successive application of the half reactions A and B produce a layer-by-layer silicon dioxide deposition. The resulting silicon dioxide films are highly uniform and extremely smooth. Each reagent is removed from the deposition chamber between successive reactions by means of evacuation or inert gas purging.

However, the drawback to the above technique is that it requires temperatures of greater than 600° K and reactant exposures of greater than $10^9$ L for the surface reactions to reach completion (1 L=$10^{-6}$ Torr sec). As noted above, high temperature procedures will not be acceptable for ultra-thin film deposition because of the likelihood of interlayer diffusion.

As a result, there is a need for an improved atomic layer controlled growth of thin films that can be carried out at low temperatures and requires much smaller fluxes of reagents.

SUMMARY OF THE INVENTION

The present invention addresses the aforenoted need by providing an improved method of growing thin films on functionalized substrates at low temperatures. The functionalized substrate on which a film is to be grown includes a first functional group. In the case of the growth of silicon dioxide film on a silicon dioxide substrate, the silicon dioxide substrate is functionalized with an OH group which is referred to as a first functional group below.

The method of the present invention includes the step of exposing a functionalized substrate to a catalyst that is a Lewis base or Lewis acid and a first molecular precursor which includes the primary element of the film to be grown and a second functional group. The catalyst first interacts with the first functional group of the functionalized substrate. Then, the first molecular precursor reacts with the first functional group which is activated by the catalyst resulting in a displacement of the catalyst and a bond between the first functional group of the substrate and the primary element of the first molecular precursor. These two reactions mark the beginning of the film formation and achieve the result of a half-reaction but at a much lower temperature.

After any excess first molecular precursor and byproducts are evacuated or purged away from the reaction chamber, the substrate is then exposed to additional catalyst and a second molecular precursor. The catalyst interacts with the second functional group and the second molecular precursor resulting in a displacement of the second functional group and resulting in a bond between the primary element of the first molecular precursor. Then, the second molecular precursor reacts with the bond between the element of the first molecular precursor which is activated by the catalyst resulting in a displacement of the catalyst and the deposition of the first functional group, i.e. the same group which was used to functionalize the substrate.

At this point, the first atomic layer of film has been grown. The use of a catalyst which serves as a Lewis base to activate the first functional group of the functionalized substrate enables the first functional group of the functionalized substrate to be linked or bonded to the first molecular precursor at a low temperature and low flux.

A reaction sequence for both half-reactions is provided below.

$$X_1-F_1+C \rightarrow X_1-F_1 \ldots C \quad (1)$$

$$X_1-F_1 \ldots C+F_2-X_2-F_2 \rightarrow X_1-X_2-F_2+F_1-F_2+C \quad (2)$$

$$X_1-X_2-F_2+C \rightarrow X_1-X_2-F_2 \ldots C \quad (3)$$

$$X_1-X_2-F_2 \ldots C+F_1-X_1-F_1-X_1-X_2-X_1-F_1+F_1-F_2+C \quad (4)$$

Where $F_1-X_1-F_1$ and $F_2-X_2-F_2$ represent the two precursors A and B respectively and C represents the catalyst; $X_1-F_1$ represents a functionalized substrate; C represents the catalyst, which may be the same catalyst for both reactions 1 and 3 or which may be different catalysts for reactions 1 and 3; $F_1$ represents the first functional group; $F_2-X_2-F_2$ represents the first molecular precursor wherein $X_2$ is the primary element of the film to be grown and, in some cases, may be the same as the primary element of the functionalized substrate, and wherein $F_2$ is a second functional group; and wherein $F_1X_1F_1$ is the second molecular precursor which supplies a first functional group $F_1$ in reaction 4.

Further, equations 1–4 may be rewritten as two binary half-reactions A and B as follows:

$$X_1-F_1^*+C+F_2X_2F_2 \rightarrow X_1-X_2-F_2^*+C+F_1F_2 \quad (1,2=A)$$

$$X_1-X_2-F_2^*+C+F_1X_1F_1 \rightarrow X_1-X_2-X_1-F_1^*+C+F_1F_2 \quad (3,4=B)$$

wherein the asterisk (*) designates the surface species.

In practice, reactions 1 and 2 are carried out together in the deposition chamber as half-reaction A after which the chamber is evacuated or purged before reactions 3 and 4 are carried out together as half-reaction B.

In an exemplary embodiment of the present invention, the reactions for forming a thin film of silicon dioxide on a functionalized silicon dioxide substrate are as follows:

$$Si-OH^*+C_5H_5N \rightarrow Si-OH \ldots NC_5H_5^* \quad (5)$$

$$Si-OH \ldots NC_5H_5^*+SiCl_4 \rightarrow Si-OSiCl_3^*+C_5H_5N+HCl \quad (6)$$

$$Si-OSiCl_3^*+C_5H_5N \rightarrow Si-OSiCl_3 \ldots NC_5H_5^* \quad (7)$$

$$Si-OSiCl \ldots NC_5H_5^*+H_2O \rightarrow Si-OSiOH^*+C_5H_5N+HCl \quad (8)$$

or, combining equations 5 and 6 and equations 7 and 8 to be rewritten into two half-reactions A and B:

$$Si-OH^*+C_5H_5N+SiCl_4 \rightarrow Si-O-Si-Cl_3^*+HCl+C_5H_5N \quad (5,6=A)$$

$$Si-O-Si-Cl^*+C_5H_5N+H_2O \rightarrow Si-O-Si-OH^*+HCl+C_5H_5N \quad (7,8=B)$$

wherein the asterisk (*) denotes the surface species.

In practice, the functionalized substrate is placed in an evacuated chamber at a temperature of less than 200° C. The catalyst and the first molecular precursor are then introduced into the chamber. The catalyst interacts with the first functional group of the functionalized substrate which facilitates the subsequent reaction of the first molecular precursor with the first functional group of the functionalized substrate resulting in a bond between the first molecular precursor and the substrate.

The chamber is then evacuated or purged before additional catalyst and the second molecular precursor are introduced into the chamber. The additional catalyst activates the reaction of the second functional group from the first molecular precursor. After the second molecular precursor has reacted, the first layer of film has been formed. The chamber may then be evacuated and the process begun again but with the catalyst interacting with the newly added first functional group as opposed to a first functional group of the functionalized substrate.

In an embodiment, the functionalized substrate is a silicon dioxide substrate or a silicon substrate functionalized with hydroxyl groups.

In an embodiment, the second molecular precursor is water.

In an embodiment, the second molecular precursor is hydrogen peroxide.

In an embodiment, the functionalized substrate is silicon nitride functionalized with amino groups.

In an embodiment, the second molecular precursor is ammonia.

In an embodiment, the first functional group is a hydroxyl group.

In an embodiment, the first functional group is an amino group.

In an embodiment, the film to be grown is silicon dioxide.

In an embodiment, the first molecular precursor is silicon tetrachloride.

In an embodiment, the film to be grown is silicon nitride.

In an embodiment, the catalyst is pyridine.

In an embodiment, the steps of the method of the present invention are carried out at temperatures less than 200° C.

In an embodiment, the method of the present invention is carried out at or about room temperature.

It is therefore an advantage of the present invention to provide a method of growing an atomic layer controlled film at temperatures of less than 200° C.

Another advantage of the present invention is that it provides a method of growing an atomic layer controlled film at room temperature.

Another advantage of the present invention is that it provides a method of growing ultra thin films on substrates using inexpensive and relatively safe reagents and catalysts.

Additional features and advantages are described in, and will be apparent from, the detailed description of the presently preferred embodiments and from the figures.

DETAILED DESCRIPTION OF THE PRESENTLY PREFERRED EMBODIMENTS

Figure 1:
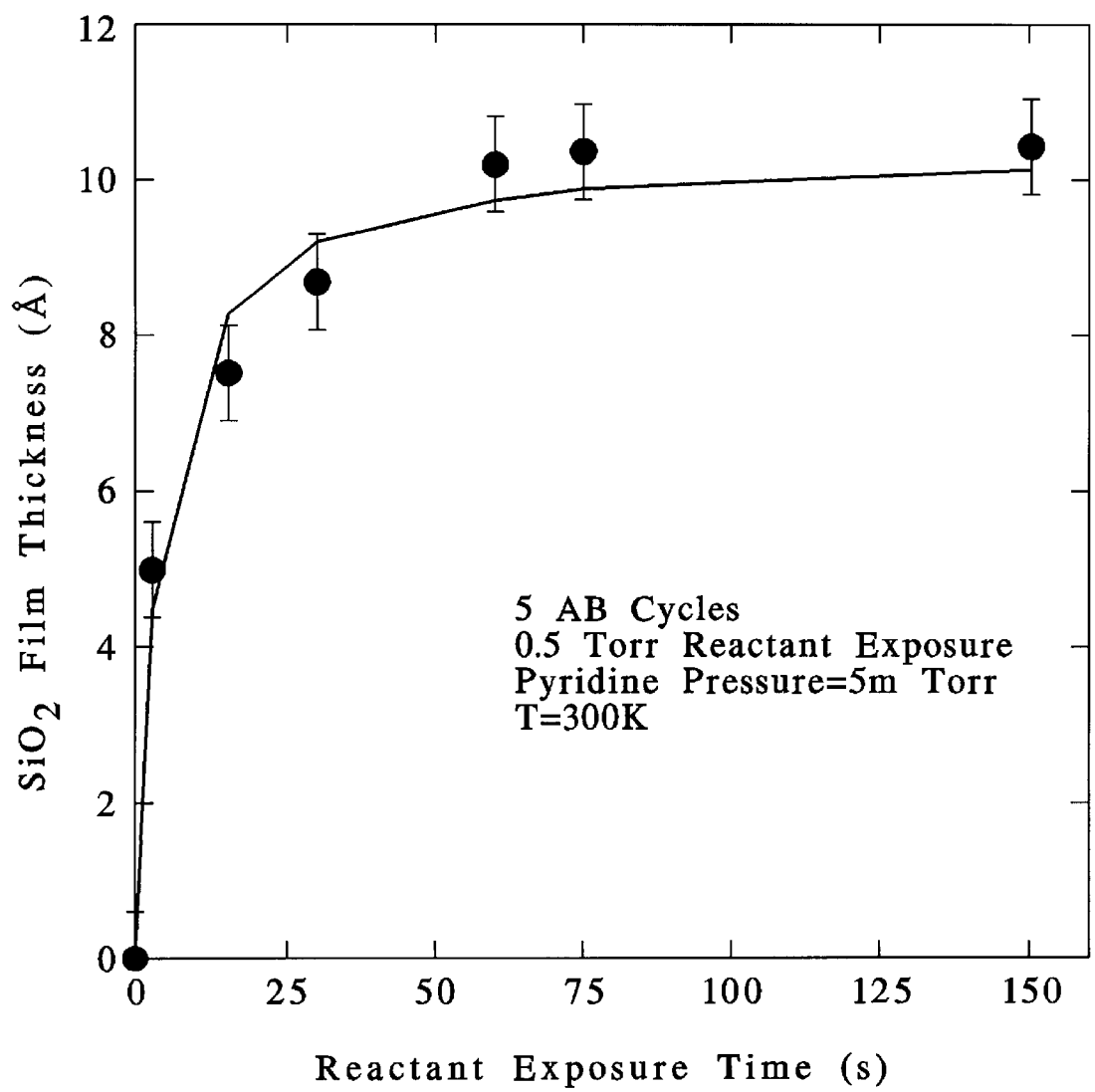
FIG. 1 illustrates, graphically, the growth of a $SiO_2$ film at room temperature with the addition of 5 mTorr of pyridine during each half-reaction cycle.

The present invention provides a method for growing films on a functionalized substrate at room temperature or near room temperatures using a catalyst to activate surface species in both half-reactions. In general, the two half-reactions may be written as follows:

$$X_1\text{-}F_1^* + C + F_2X_2F_2 \rightarrow X_1\text{-}X_2\text{-}F_2^* + C + F_1F_2 \qquad (1,2\text{=}A)$$

$$X_1\text{-}X_2\text{-}F_2^* + C + F_1X_1F_1 \rightarrow X_1\text{-}X_2\text{-}X_1\text{-}F_1^* + C + F_1F_2 \qquad (3,4\text{=}B)$$

wherein $X_1\text{-}F_1^*$ represents a functionalized substrate with $X_1$ being an element of the substrate and $F_1$ representing the functional group, or the first functional group of the functionalized substrate. C represents the catalyst and $F_2X_2F_2$ and $F_1X_1F_1$ represent the first and second molecular precursors, respectively.

As seen from the half-reaction A (1,2), the catalyst C facilitates the activation of the first functional group $F_1$ on the substrate surface thereby enabling a bonding between the element $X_2$ of the first molecular precursor $F_2X_2F_2$ to the element $X_1$.

In the second half-reaction B (3,4), the catalyst activates the second functional group $F_2^*$ and facilitates the substitution of the second functional group $F_2^*$ with the element and functional group $X_1F_1$.

In an exemplary embodiment, the two half-reactions for growing an $SiO_2$ film on a functionalized $SiO_2$ substrate utilizing pyridine ($C_5H_5N$) as a catalyst, $SiCl_4$ as a first molecular precursor and water as a second molecular precursor are as follows:

$$\text{Si—OH}^* + C_5H_5N + SiCl_4 \rightarrow \text{Si—O—Si—Cl}_3^* + HCl + C_5H_5N \quad (5,6\text{=}A)$$

$$\text{Si—O—Si—Cl}_3^* + C_5H_5N + H_2O \rightarrow \text{Si—O—Si—OH}^* + HCl + C_5H_5N \quad (7,8\text{=}B)$$

One procedure for growing silicon dioxide thin films on a functionalized silicon dioxide substrate is as follows.

Experimental Procedure

Films were grown using the method of the present invention on an apparatus which consisted of a sample load lock chamber, a central deposition chamber and an ultra high vacuum chamber for surface analysis. The central deposition chamber is capable of automated dosing of molecular precursors under a wide variety of conditions. The deposition chamber is pumped with either a 175 l/s diffusion pump equipped with a liquid $N_2$ trap or two separate liquid $N_2$ traps backed by mechanical pumps. This chamber has a base pressure of $1\times10^{-7}$ Torr.

The central deposition chamber is equipped with an in situ spectroscopic ellipsometer (J. S. Woolam Co. M-44) which collects ellipsometric data at 44 visible wavelengths simultaneously. The ellipsometer is mounted on ports positioned at 80° with respect to the surface normal. The ports are equipped with gate valves to protect the birefringent-free ellipsometer windows from being deposited on during the film growth. The surface analysis chamber is equipped with a UTI-100C quadrupole mass spectrometer and is pumped by a 210 L/s turbo pump to obtain a base pressure of $1\times10^{-9}$ Torr. Mass spectrometric analysis of the gases in the central deposition chamber can be performed using a controlled leak to the surface analysis chamber.

The sample substrate was 0.75×0.75 inch Si(100) wafer. The Si(100) sample was p-type, boron-doped with a resistivity of $p=0.1$–$0.4$ $\Omega cm$. A 3000 Å Mo film deposited on the back of the sample was used to resistively heat the sample. The sample was mounted using tantalum and molybdenum foils and molybdenum clips. The sample temperature was determined by a Chromel-Alumel thermocouple attached to the crystal with a high thermal conductivity ceramic glue. The Si(100) samples were cleaned with methanol and acetone and blown free of particles before mounting and loading into the chamber. The Si(100) surface was then cleaned by an 845 K anneal for 1 minute followed by a 300 K high frequency water plasma discharge to fully hydroxylate the surface and remove surface carbon contamination. The cleaning procedure does not remove the approximately 20 Å native oxide from the Si(100) wafer. Immediately following the cleaning procedure, the substrate temperature was ramped to the desired reaction temperature for film growth.

The film growth experiments for the growth of $SiO_2$ were performed between 300–375 K. An initial reaction cycle was carried out manually in order to check the purity of the first molecular precursor ($SiCl_4$) and second molecular precursor ($H_2O$) and ensure proper operation of the apparatus. The catalyst (pyridine) was flowed through the chamber until its parent mass 79 is observed in the controlled leak of molecules between the central deposition chamber and surface analysis chamber. The central deposition chamber was then filled with a static pyridine pressure of 5–300 mTorr.

$SiCl_4$ was then dosed into the reaction chamber until the $SiCl_3$ mass fragment was observed in the mass spectrum (see reaction Nos. 5 and 6 above). The pyridine/$SiCl_4$ combination was allowed to react for several minutes before being pumped away.

After removal of the pyridine/$SiCl_4$ combination, a pyridine/$H_2O$ mixture was introduced into the chamber in a similar fashion (see reaction Nos. 6 and 7 above). After this initial reaction cycle, automated dosing cycles were employed where the Si(100) sample was alternately exposed with a $SiCl_4$/pyridine mixture or a $H_2O$/pyridine mixture at various pressures and exposure times.

The $SiCl_4$ half-reaction could not be initiated before the water partial pressure dropped below $10^{-4}$ Torr without multilayer $SiO_2$ growth. This is attributed to both gas phase reactions of $SiCl_4$ with residual $H_2O$ as well as reaction with physically adsorbed $H_2O$ which adsorbs strongly to silica.

In situ spectroscopic ellipsometry was used to monitor the $SiO_2$ film growth. The ellipsometer (J. S. Woolam, M-44) employed a Xe arc lamp as the broadband light source. The light is focused onto a fiber optic which couples the light into the reaction chamber. These fibers typically have a 200 micron core diameter and transmit light efficiently in the visible region (400–800 nm). The unpolarized light from the Xe source passes through a linear polarizer before entering the reaction chamber. This light is then reflected off the $SiO_2$/Si(100) sample upon which it becomes elliptically polarized. The ellipticity of the reflected light is measured with a rotating analyzer detector. A continuously rotating linear polarizer modulates the amount of light transmitted to the detector. This light is dispersed onto a 44 element silicon array by a monochromator which allows ellipsometric data to be collected at 44 visible wavelengths simultaneously. The time dependent light intensity can be related to the polarization state of the light. The change in polarization of the input light induced by the thin $SiO_2$ film is then fit to a model in which the $SiO_2$ film thickness and the $SiO_2$ film refractive index are the unknown physical parameters. The parameters are varied until the calculated data very closely matches the measured optical data. Since the index of refraction of very thin films is hard to determine, bulk $SiO_2$ optical constants were assumed. The accuracy of this assumption was examined by collecting ex situ data on a 100 Å thick $SiO_2$ film at multiple angles of incidence. This configuration permits the $SiO_2$ optical constants to be uniquely determined. The measured index of refraction of 1.43±0.03 agrees with the index of refraction of a dense thermal oxide within experimental error.

The surface topography of the $SiO_2$ films was measured using a NanoScope III atomic force microscope (AFM) in tapping mode. The AFM images were collected within 1–2 hours of removing the samples from vacuum to prevent surface contamination by ambient dust particles. Scan lengths of 250 nm–1.2 μm were performed using a 1.2 μm scanning head. The AFM images were conditioned to remove AFM artifacts using the software provided by Digital Instruments.

Experimental Results

Based on previous work which indicated the half-reactions didn't go to completion at temperatures less than or equal to 600 K, initial experiments were performed at these temperatures to see if the addition of pyridine would catalyze the half-reactions. There was no observable change in the reaction kinetics with the addition of pyridine at these temperatures. This is attributed to the short surface lifetime of the pyridine at these elevated temperatures. The temperature was dropped down to room temperature and sequential half-reaction cycles were run without pyridine present to see if any film growth occurred. At room temperature, there was no observable film growth.

As noted above, the half-reactions A and B for the production of $SiO_2$ film using $SiCl_4$ and water as molecular precursors has been carried out in accordance with the present invention using a catalyst (e.g. pyridine) to activate the surface species and lower the required reaction temperature and flux. Using a catalyst, reactions 5 and 6 produce the surface species product Si—O—Si—Cl* of half-reaction A and may be carried out in a single procedural step (i.e. the $SiCl_4$ and catalyst are introduced into the chamber together).

Similarly, reactions 6 and 7 above produce the surface species Si—O—Si—OH* of half-reaction B and may be carried out in a single procedural step (i.e. the catalyst and $H_2O$ are introduced into the chamber together). Therefore, for purposes of clarity, the sequential carrying out of reactions 5, 6 and then reactions 7, 8 will hereinafter be referred to as an "AB" cycle.

After 5 AB cycles were run at room temperature, no observable $SiO_2$ film growth was measured for reactant exposures up to $10^{10}$ L. However, the addition of a small amount of pyridine during the A and B half-reactions at room temperature initiated $SiO_2$ film growth. FIG. 1 illustrates that $SiO_2$ film growth occurs at room temperature with the addition of 5 mTorr of pyridine during each half-reaction of the AB cycle. The $SiO_2$ film thickness was measured after 5 AB cycles for various 0.5 Torr reactant exposure times. The $SiCl_4$ exposures were equal to the $H_2O$ exposures.

A typical AB cycle occurred with the following sequence: Dose pyridine (5 mTorr)/Dose $SiCl_4$ (0.5 Torr)/Static fill for variable reaction times/Evacuate ($10^{-4}$ Torr)/Dose pyridine (5 mTorr)/Dose $H_2O$ (0.5 Torr)/Static fill for variable reaction times/Evacuate ($10^{-4}$ Torr). FIG. 1 illustrates that the $SiO_2$ film thickness is dependent on reactant exposure for times less than 75 seconds. This behavior indicates that the surface reactions have not reached completion. In contrast, both half-reactions have saturated for times greater than 75 seconds and additional reactant exposure produces no additional film growth. This type of behavior is the hallmark of self-limiting surface reactions.

Since all of the $SiO_2$ film growth experiments employed equal reactant exposures, the kinetics of the slower half-reaction are controlling the experimental observations. With the intention of extracting kinetic parameters from the time dependent and temperature dependent data then, the limiting half reaction can be determined. This aspect of the $SiO_2$ film growth was studied by reducing the $H_2O$ exposure time to one-quarter of the $SiCl_4$ exposure time and performing 5 AB cycles. The $SiO_2$ growth was unaffected by the reduced $H_2O$ exposure time. In contrast, reducing the $SiCl_4$ exposure resulted in smaller $SiO_2$ growth rates. This indicates that the $SiCl_4$ half-reaction was limiting the $SiO_2$ film growth. All subsequent experiments employed equal reactant pressures and exposure times and were controlled by the $SiCl_4$ half-reaction kinetics.

The $SiO_2$ growth was studied as a function of both the catalyst partial pressure and the reactant exposures. The dependence on pyridine partial pressure was investigated by fixing the $SiCl_4$ and $H_2O$ exposures at 15 mTorr for 5 seconds. The temperature was fixed at 300 K. The $SiO_2$ film thickness was measured after 5 AB cycles as a function of the partial pressure of pyridine.

Figure 2:
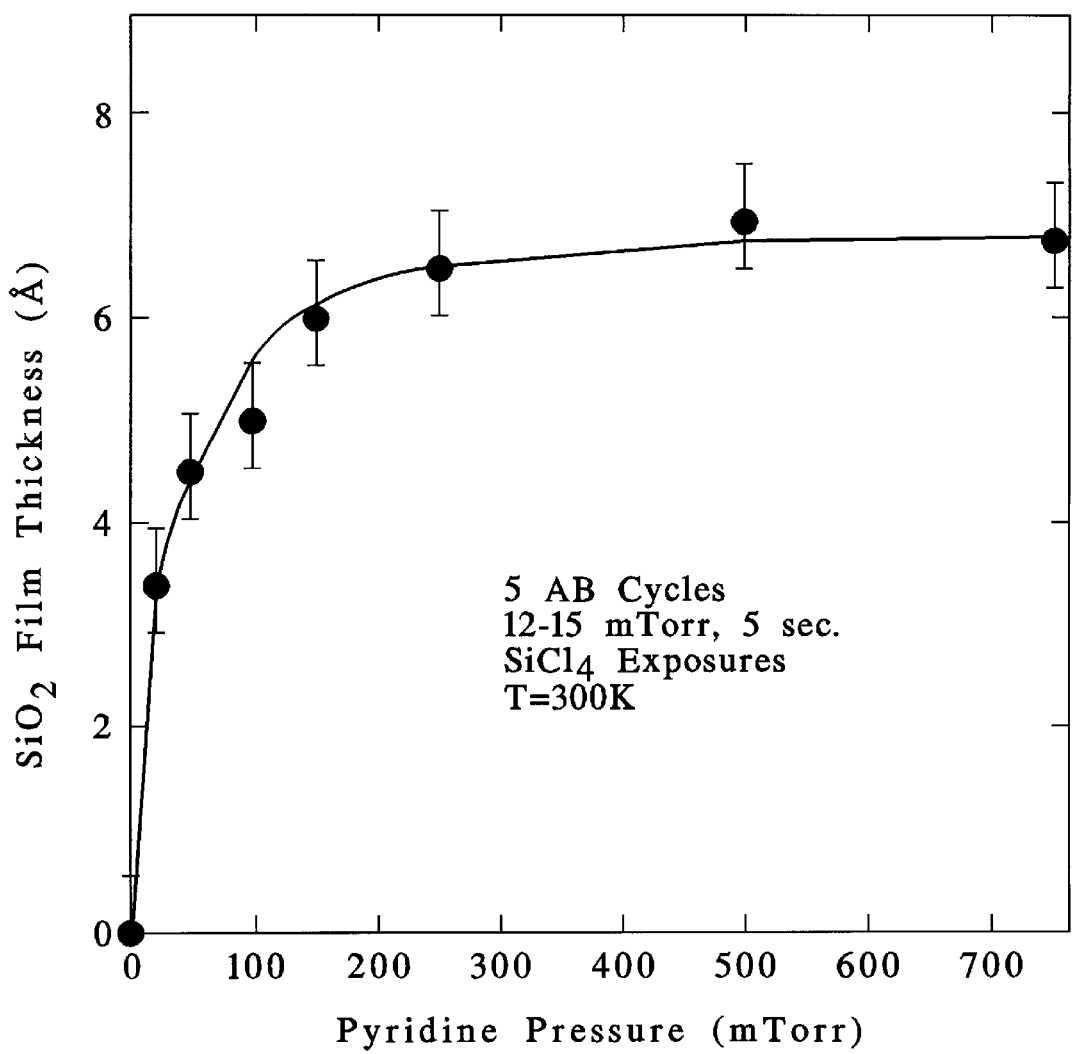
FIG. 2 illustrates, graphically, the dependence of $SiO_2$ film growth rate on pyridine partial pressure.

FIG. 2 illustrates that for the particular conditions described above, the $SiO_2$ film growth becomes independent of pyridine partial pressure for pressures greater than or equal to 200 mTorr. The saturation of the $SiO_2$ film growth is attributed to nearly complete monolayer coverage of the reactive surface functional groups by the pyridine at pressures greater than or equal to 200 mTorr.

To verify this conclusion, the adsorption kinetics of pyridine on a hydroxylated silica surface were examined. Previous investigations have measured the pyridine adsorption energy on a hydroxylated silica surface using both FTIR and calorimetry methods. The measured adsorption energy ranges from 15–17 kcal/mole depending on the technique employed and the type of silica surface. These studies employed high surface area silica powders which can vary substantially in defect density, internal $H_2O$ content, surface curvature, strain and alkali ion content. Moreover, the desorption kinetics are always convoluted with the transport kinetics of the adsorbates from the micropores. These complications result in a broad range of measured adsorption energies. To better define the pyridine adsorption energy, a multilayer adsorption experiment was performed on a hydroxylated, well-defined planar silica surface.

Figure 3:
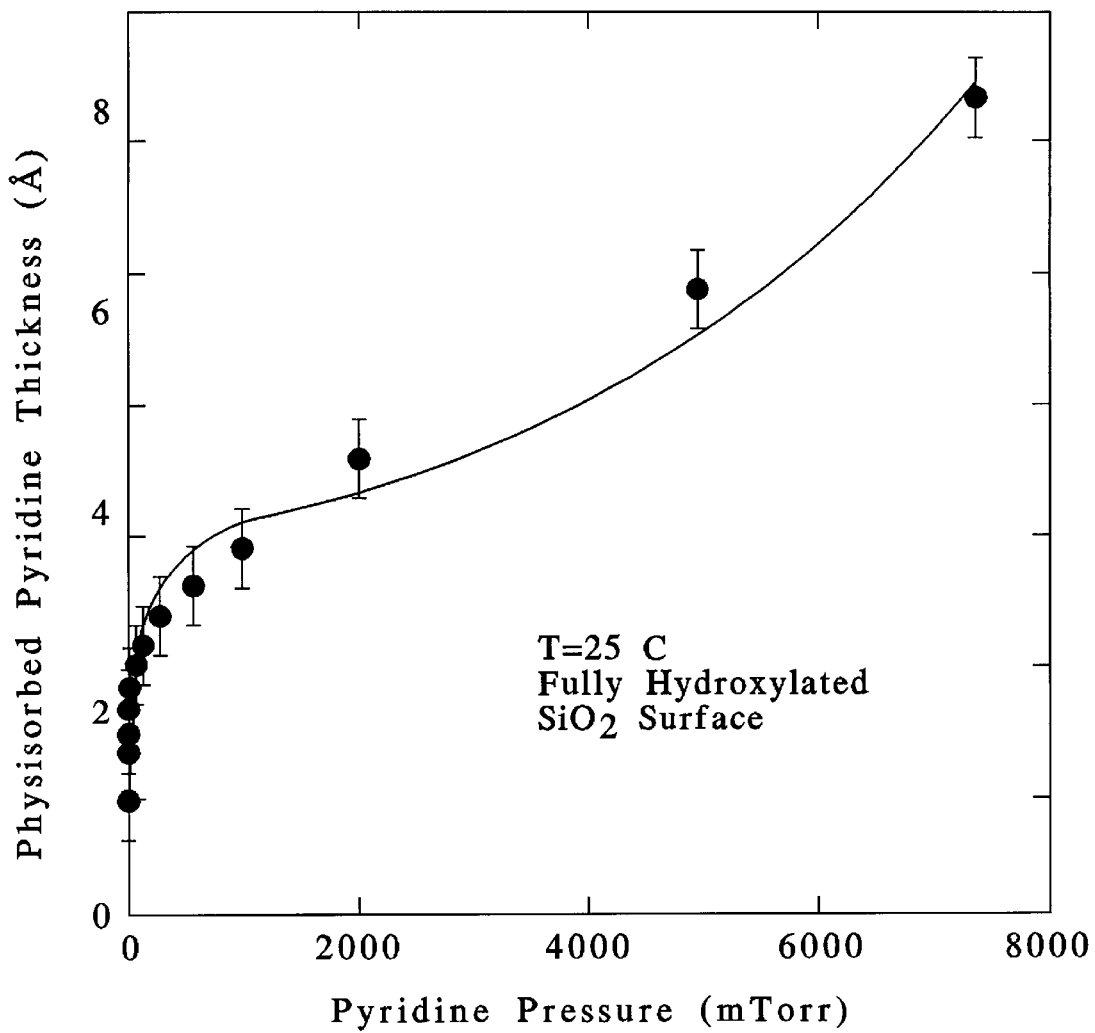
FIG. 3 illustrates the adsorption of pyridine at varying pyridine partial pressures on a $SiO_2$ substrate surface.

In this experiment, the thickness of a physisorbed pyridine layer on a planar $SiO_2$ surface was studied as a function of pyridine pressure. FIG. 2 illustrates that the presence of pyridine accelerates the half-reactions with increasing partial pressure of pyridine up to 200 mTorr. Pressures greater than 200 mTorr resulted in no further enhancement of the reactions. The resulting isotherm was fit using a B.E.T. multilayer adsorption model as illustrated in FIG. 3. The model predicts an adsorption energy of approximately 15.3 kcal/mole assuming a typical preexponential for localized adsorption of $5 \times 10^{15}$/s. This result is within the range of adsorption energies measured previously on silica powders. The measured adsorption kinetics also indicate that the SiOH* surface species are completely titrated with pyridine molecules for pyridine pressures greater than or equal to 200 mTorr. Additional pyridine pressure should no longer affect the reaction kinetics as observed.

Figure 4:
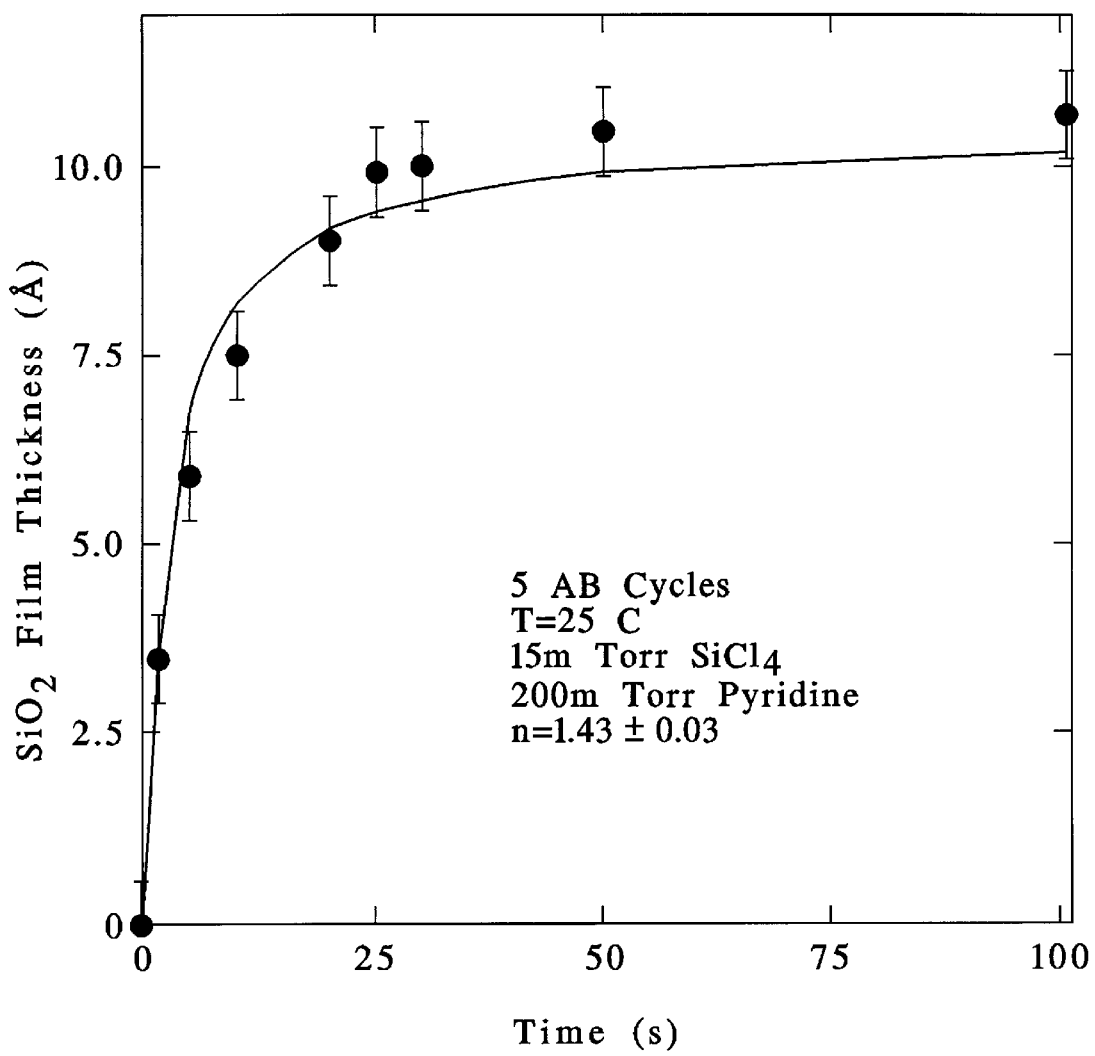
FIG. 4 illustrates, graphically, the growth of a $SiO_2$ film after 5 sequential half-reaction cycles using 15 mTorr $SiCl_4$ and 200 mTorr pyridine.
Figure 5:
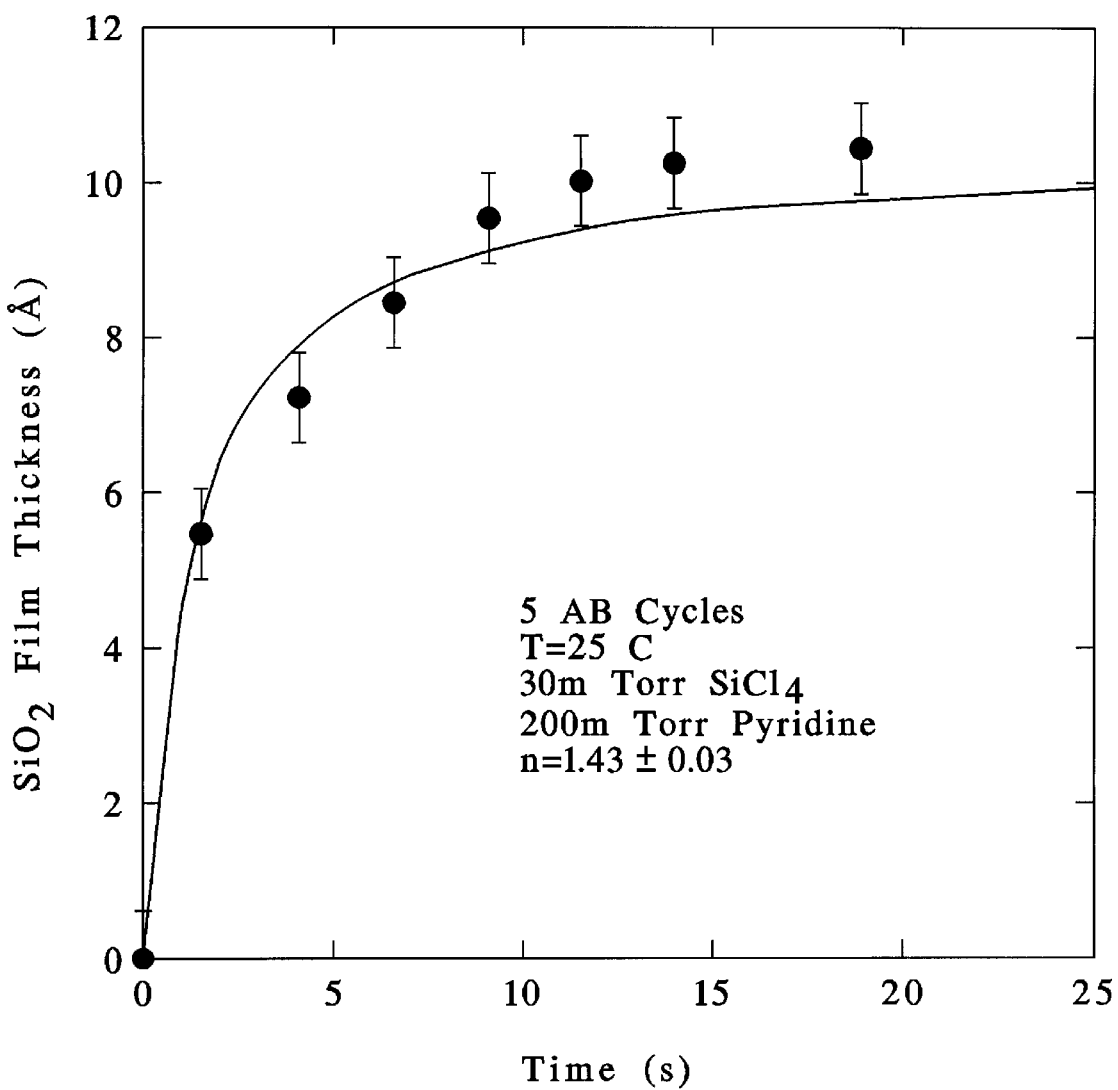
FIG. 5 illustrates, graphically, the growth of a $SiO_2$ film after 5 sequential half-reaction cycles using 30 mTorr $SiCl_4$ and 200 mTorr pyridine.

Once the optimal partial pressure of pyridine was established, the dependence of the half-reactions on the precursor flux was examined. The pyridine partial pressure was fixed at 200 mTorr to maximize the reaction efficiency as discussed previously. The thickness of $SiO_2$ deposited after 5 AB cycles at 300 K was measured for various reactant exposure times. Experiments were run at both 15 mTorr and 30 mTorr reactant pressures. FIGS. 4 and 5 illustrate the results of these experiments. The two figures illustrate that the half-reactions are self-terminating in agreement with FIG. 1. Note that the reaction at 30 mTorr saturates in approximately one-half the time it takes the 15 mTorr reaction to saturate. This implies the $SiO_2$ growth has a linear dependence on $SiCl_4$ partial pressure. This feature of the $SiO_2$ growth will be useful in developing a kinetic model for the $SiO_2$ growth.

Figure 6:
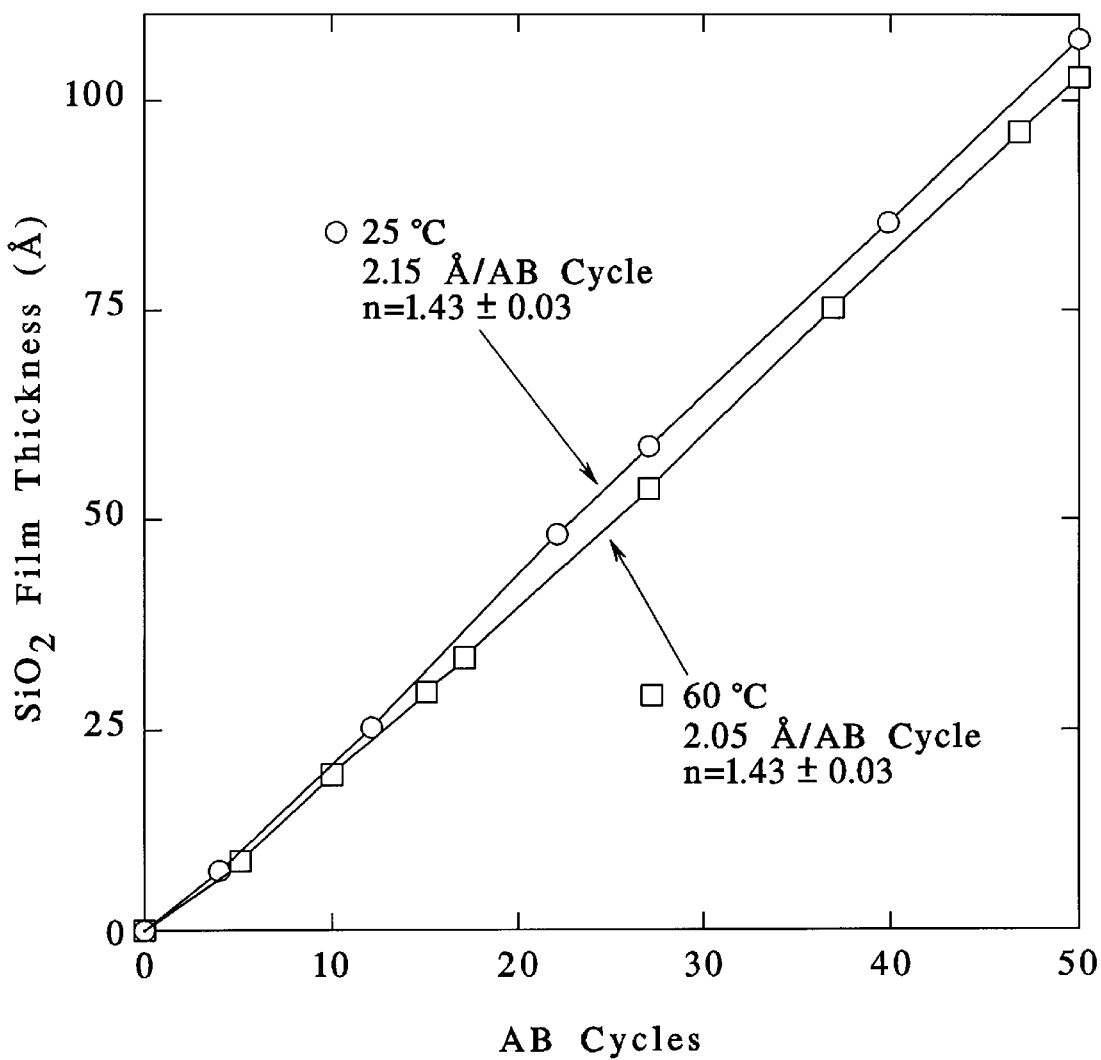
FIG. 6 illustrates, graphically, the direct proportional relationship between $SiO_2$ film thickness and the number of sequential half-reaction cycles run.

FIG. 6 illustrates that the $SiO_2$ film thickness is directly proportional to the number of AB cycles. The $SiO_2$ film thickness was measured periodically after performing multiple numbers of saturation AB cycles. The $SiO_2$ film thickness was measured for up to 50 AB cycles. The measured growth rate at 300 K is 2.15 Å/AB cycle and at 335 K is 2.05 Å/AB cycle. The constant growth rate is an important aspect of the $SiO_2$ film growth. Strong amine bases like triethylamine $((C_2H_5)_3N)$ have been shown to form salt compounds like triethylammonium chloride $(NH^+(C_2H_5)_3Cl^-)$ in the presence of chlorosilanes. These salts could poison the surface and degrade the reaction efficiency as they build up. FIG. 6 illustrates that the growth rate is linear up to 50 AB cycles and that salt formation is probably not a problem. The presence of $H_2O$ may also facilitate the removal of surface salts. The slight decrease of the growth rate with increasing temperature can be attributed to a slightly lower coverage of the reactive hydroxyl groups as the substrate temperature is increased. This effect is more pronounced in the high temperature growth of $SiO_2$ films. The growth rate per AB cycle was shown to drop from 1.1 Å/AB cycle at 600 K to 0.75 Å/AB cycle at 800 K. The linearity of the growth rate with AB cycles also indicates that the number of reactive sites is staying constant. The constant growth rate per AB cycle indicates that the film should grow conformally over all areas of the surface without significant roughening.

Figure 7:
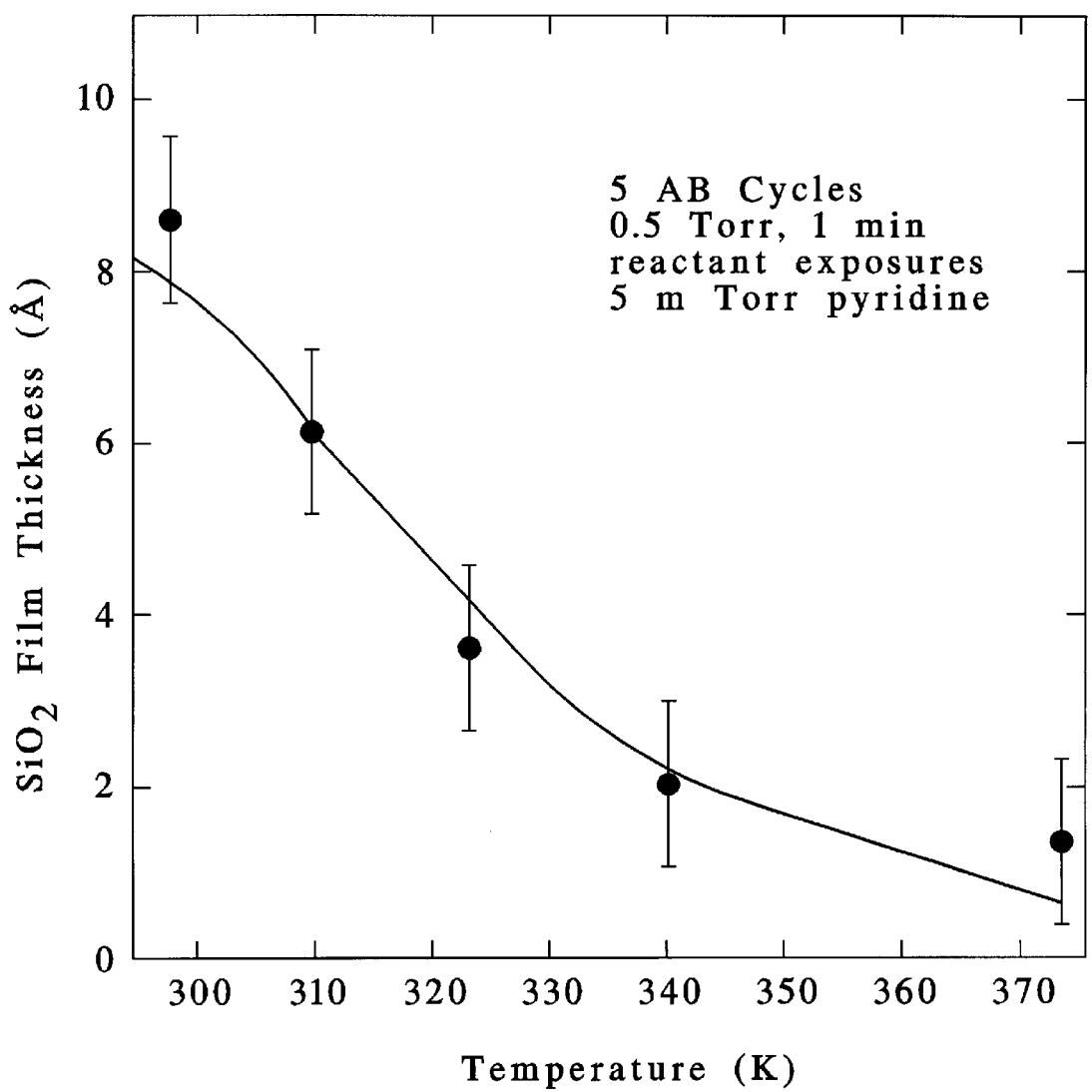
FIG. 7 illustrates, graphically, the dependence of $SiO_2$ film growth rate on reaction temperature.

The surface topography of the $SiO_2$ films was studied using an atomic force microscope (AFM) [Digital Instruments-Nanoscope III). The scans were taken in tapping mode and varied in size from 1.2 µm down to 250 nm. FIG. 7 illustrates a 1.2 µm scan of an $SiO_2$ film after 50 saturation AB cycles at 300 K. The gray scale in FIG. 10 spans less than 10 Å light-to-dark. The films had an RMS roughness of ±3 Å. In comparison, the RMS roughness of a cleaned Si(100) wafer was ±2 Å and the roughness of a $SiO_2$ film grown at 700 K was ±3 Å. In addition, the $SiO_2$ surface exhibits the same statistical characteristics as the Si(100) wafer and $SiO_2$ grown at high temperatures. This indicates that the $SiO_2$ film grows conformally and without significant roughening. These observations are consistent with the constant growth rate per AB cycle discussed previously.

The temperature dependence of the half-reaction rates was investigated by fixing the reactant and catalyst exposures. The $H_2O$ and $SiCl_4$ exposures were 0.5 torr for 60 s. The pyridine partial pressure was fixed at 5 mTorr. FIG. 7 illustrates that the $SiO_2$ film thickness measured after 5 AB cycles decreased dramatically with increasing substrate temperature. Previous work at high temperatures showed a decrease in the deposition rate per AB cycle with increasing temperature (Ref APL). This decrease in the deposition rate is attributed to the loss of reactive hydroxyl groups by surface dehydration at elevated temperatures. In the temperature regime employed in this study the number of hydroxyl groups remains constant and cannot explain the dramatic drop off in the growth rate with temperature. Instead, the overall reduction in $SiO_2$ growth at higher temperatures is a result of two competing processes. The net reaction rate is controlled by both the number of surface reactant species and the rate at which the reactants are converted to products. The coverage of molecular reactants on the surface exhibits an exponential decrease in temperature while the rate at which these reactants are converted to products exhibits an exponential increase with temperature. The overall reduction in $SiO_2$ growth with increasing temperature indicates that the coverage of molecular reactants dominates the observed kinetics. The temperature dependence and time dependence of the $SiO_2$ growth can be used to calculate the rate constant for the reaction of $SiCl_4$ with a hydroxylated silica surface if a suitable model for the reaction is developed.

Accordingly, an improved method of forming atomic layer thin films on functionalized substrates is provided which can be formed at room temperature. It is anticipated that the method described herein will be applicable to substrates other than silicon dioxide substrates and the formation of films other than silicon dioxide films. Specifically, it is anticipated that the method provided herein will apply to any functionalized substrate to which a thin film may be bonded to and further to any film which includes a primary element which can be functionalized by a functional group as illustrated generally in reactions 1–4 set forth above. Suitable substrates may include metal or non-metal primary elements and functional groups other than —OH groups. Catalysts serving as Lewis bases or Lewis acids other than pyridine may also be utilized. Further, it will be noted that the structure of the thin film and the substrate need not be identical and the thin film may include a primary element that is different from the primary element of the substrate. First molecular precursors other than $SiCl_4$ can be utilized to the extent that the first molecular precursor provides a functionalized primary element of the film to be formed as illustrated in reactions 1 and 2 above. Further, it is anticipated that it may be beneficial to use a different catalyst for the half-reaction A, or reactions 1 and 2 than for half-reaction B, or reactions 3 and 4.

It should also be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

What is claimed is:

1. A method of growing a film that includes a first element and a second element on a functionalized substrate having a first functional group, the method comprising:

carrying out a first half-reaction of a binary reaction sequence by exposing the substrate to a first catalyst and a first molecular precursor comprising the first element of the film bonded to a second functional group resulting in the first element of the first precursor being bonded to the substrate and the first functional group being displaced; and carrying out a second half-reaction of the binary reaction sequence by exposing the first precursor to a second catalyst and a second molecular precursor comprising the second element of the film resulting in the second element of the second precursor being bonded to the first element and the second functional group being displaced.

2. The method of claim 1 wherein the first catalyst and the second catalyst are the same.

3. The method of claim 1 wherein the first half-reaction is carried out at a temperature less than 200° C.

4. The method of claim 1 wherein the second half-reaction is carried out at a temperature less than 200° C.

5. A method for growing a film on a functionalized substrate, the film comprising a primary element, the functionalized substrate comprising a first functional group, the method comprising the following steps:

a. carrying out the following interaction:

$$X_1F_1 + C \rightarrow X_1F_1 \ldots C$$

wherein $X_1F_1$ is the functionalized substrate and $F_1$ is the first functional group, and C is a catalyst;

b. carrying out the following reaction:

$$X_1F_1 \ldots C + F_2X_2F_2 \rightarrow X_1X_2F_2 + C + F_1F_2$$

wherein $F_2X_2F_2$ is a first molecular precursor with $X_2$ being the primary element of the film and $F_2$ being a second functional group;

c. carrying out the following interaction:

$$X_1X_2F_2 + C \rightarrow X_1X_2F_2 \ldots C; \text{ and}$$

d. carrying out the following reaction:

$$X_1X_2F_2 \ldots C + F_1X_1F_1 \rightarrow X_1X_2X_1F_1 + C + F_1F_2$$

wherein $F_1X_1F_1$ is a second molecular precursor comprising the first functional group $F_1$.

6. The method of claim 5 wherein the first functional group $F_1$ of the functionalized substrate $X_1F_1$ is —OH.

7. The method of claim 6 wherein the second molecular precursor $F_1X_1F_1$ is $H_2O$.

8. The method of claim 6 wherein the second molecular precursor $F_1X_1F_1$ is $H_2O_2$.

9. The method of claim 5 wherein the first functional group $F_1$ of the functionalized substrate is —$NH_2$.

10. The method of claim 9 wherein the second molecular precursor $F_1X_1F_1$ is $NH_3$.

11. The method of claim 5 wherein the film is $SiO_2$.

12. The method of claim 5 wherein the first molecular precursor $F_2X_2F_2$ is $SiCl_4$.

13. The method of claim 5 wherein the film is $Si_3N_4$.

14. The method of claim 5 wherein the catalyst is $C_5H_5N$.

15. The method of claim 5 wherein the steps are carried out at a temperature of less than 200° C.

16. The method of claim 5 wherein the steps are carried out at a temperature of about 25° C.

17. The method of claim 5 further comprising the following steps:

e. carrying out the following interaction:

$$X_1X_2X_1F_1 + C \rightarrow X_1X_2X_1F_1 \ldots C;$$

f. repeating steps b through e.

18. A method of growing a film on a functionalized substrate, the film comprising a primary element, the functionalized substrate comprising a first functional group, the method comprising the following steps:

a. interacting a catalyst selected from the group consisting of Lewis bases and Lewis acids with the first functional group of the functionalized substrate;

b. reacting a first molecular precursor comprising the primary element of the film bonded to a second functional group with the first functional group that is activated by the catalyst resulting in a displacement of the catalyst at the first functional group and a bond between the first molecular precursor and the substrate;

c. interacting the catalyst with the second functional group and the primary element of the first molecular precursor; and d. reacting a second molecular precursor comprising the first functional group with the activated second functional group resulting in a displacement of the catalyst and resulting in a bond between the elements of the first and second molecular precursors.

19. The method of claim 18 wherein the first functional group of the functionalized substrate is —OH.

20. The method of claim 19 wherein the second molecular precursor is $H_2O$.

21. The method of claim 19 wherein the second molecular precursor is $H_2O_2$.

22. The method of claim 18 wherein the first functional group of the functionalized substrate is —$NH_2$.

23. The method of claim 22 wherein the second molecular precursor is $NH_3$.

24. The method of claim 18 wherein the film is $SiO_2$.

25. The method of claim 18 wherein the first molecular precursor is $SiCl_4$.

26. The method of claim 18 wherein the film is $Si_3N_4$.

27. The method of claim 18 wherein the catalyst is $C_5H_5N$.

28. The method of claim 18 wherein the steps are carried out at a temperature of less than 200° C.

29. The method of claim 18 wherein the steps are carried out at a temperature of about 25° C.

30. The method of claim 18 further comprising the following steps:

e. interacting the catalyst with the first functional group bonded to a primary element of the first molecular precursor; and f. repeating steps b through e.

31. The method of claim 18 wherein the catalyst is a Lewis base.

32. The method of claim 18 wherein the catalyst is a Lewis acid.

33. The method for growing a film on a substrate, the film comprising a primary element, the substrate comprising a first functional group, the method comprising the following steps:

a. providing the substrate in a vacuum chamber at a temperature of less than 200° C.;

b. introducing a catalyst chosen from the group consisting of Lewis bases and Lewis acids and a first molecular precursor comprising the primary element of the film bonded to a second functional group, into the chamber, causing a reaction at the first functional group of the substrate resulting in a reaction between the first molecular precursor and the first functional group of the substrate;

c. evacuating the chamber;

d. introducing additional catalyst and a second molecular precursor comprising the first functional group into the chamber, causing a reaction between the second functional group and the second molecular precursor resulting in a displacement of the second functional group and a bond between the primary elements of the first and second molecular precursors.

34. The method of claim 33 wherein the chamber is evacuated by being purged.

35. The method of claim 33 further comprising the following steps:
  e. After step (d) evacuating the chamber;
  f. introducing second additional catalyst and additional first molecular precursor into the chamber, causing a reaction between the first functional group and the primary element of the first molecular precursor
  g. repeating steps c through f.

36. The method of claim 35 wherein in step (e) the chamber is evacuated by being purged.

37. A method for growing a $SiO_2$ film on a substrate comprising an —OH functional group, the method comprising the following steps:
  a. providing the substrate in a vacuum chamber at a temperature of less than 200° C.;
  b. introducing $C_5H_5N$ and $SiCl_4$ into the chamber;
  c. evacuating the chamber;
  d. introducing $C_5H_5N$ and a reagent selected from the group consisting of water and hydrogen peroxide into the chamber;
  e. evacuating the chamber; and
  f. repeating steps b through e.

38. The method of claim 37 wherein in step (e) the chamber is evacuated by being purged.

39. A method growing a $Si_3N_4$ film on a substrate comprising an —$NH_2$ functional group, the method comprising the following steps:
  a. providing the substrate in a vacuum chamber at a temperature of less than 200° C.;
  b. introducing $C_5H_5N$ and $SiCl_4$ into the chamber;
  c. evacuating the chamber;
  d. introducing $C_5H_5N$ and ammonia into the chamber;
  e. evacuating the chamber;
  f. repeating steps b through e.

40. The method of claim 39 wherein the chamber is evacuated by being purged.

* * * * *